United States Patent
Kholodenko et al.

(10) Patent No.: US 6,828,241 B2
(45) Date of Patent: Dec. 7, 2004

(54) EFFICIENT CLEANING BY SECONDARY IN-SITU ACTIVATION OF ETCH PRECURSOR FROM REMOTE PLASMA SOURCE

(75) Inventors: Arnold V. Kholodenko, San Francisco, CA (US); Peter Porshnev, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 301 days.

(21) Appl. No.: 10/041,838

(22) Filed: Jan. 7, 2002

(65) Prior Publication Data
US 2003/0129835 A1 Jul. 10, 2003

(51) Int. Cl.$^7$ ............................................. H01L 21/302
(52) U.S. Cl. ...................... 438/706; 438/710; 438/712; 156/345.35
(58) Field of Search ................. 438/706, 710, 438/712, 720; 156/345, 345.19, 345.35, 345.4; 216/57, 58, 67

(56) References Cited

U.S. PATENT DOCUMENTS

| | | | |
|---|---|---|---|
| 4,464,223 A | 8/1984 | Gorin | 156/643 |
| 4,786,352 A | 11/1988 | Benzing | 156/345 |
| 4,913,929 A * | 4/1990 | Moslehi et al. | 427/564 |
| 5,252,178 A | 10/1993 | Moslehi | 156/643 |
| 5,413,670 A * | 5/1995 | Langan et al. | 134/1.2 |
| 5,425,842 A | 6/1995 | Zijlstra | 156/643.1 |
| 5,464,499 A | 11/1995 | Moslehi et al. | 216/71 |
| 5,514,246 A | 5/1996 | Blalock | 156/643.1 |
| 5,523,261 A | 6/1996 | Sandhu | 437/228 |
| 5,581,874 A * | 12/1996 | Aoki et al. | 29/825 |
| 5,597,438 A | 1/1997 | Grewal et al. | 156/345 |
| 5,639,519 A | 6/1997 | Patrick et al. | 427/569 |
| 5,783,492 A * | 7/1998 | Higuchi et al. | 438/710 |
| 5,817,534 A | 10/1998 | Ye et al. | 438/10 |
| 5,879,575 A | 3/1999 | Tepman et al. | 216/68 |
| 6,203,657 B1 * | 3/2001 | Collison et al. | 156/345.48 |

* cited by examiner

Primary Examiner—Lan Vinh
(74) Attorney, Agent, or Firm—Moser, Patterson & Sheridan LLP

(57) ABSTRACT

An electro-negative cleaning or etchant gas, such as fluorine, that was ionized from a stable supply gas such as NH3 in a secondary chamber and recombined in the primary chamber, is re-ionized within the primary chamber by electron attachment by ionizing an electron donor gas, such as helium, in the primary chamber.

56 Claims, 5 Drawing Sheets

EFFICIENT CLEANING BY SECONDARY IN-SITU ACTIVATION OF ETCH PRECURSOR FROM REMOTE PLASMA SOURCE

BACKGROUND

Plasma reactors employed in deposition processing of semiconductor wafers (e.g., physical vapor deposition or chemical vapor deposition) tend to accumulate contaminants on the interior chamber surfaces. Such contamination occurs because the same material deposited on the wafer is also deposited on the interior chamber surfaces. Such deposits on the interior chamber surfaces, if allowed to accumulate significantly, can fall onto the semiconductor wafer and thus destroy devices formed thereon, or change the electrical properties of the chamber and thereby reduce control over the process. Process control in the wafer processing chamber is critical. Therefore, the chamber interior must be cleaned periodically to remove such contaminants.

A recently proposed technique for cleaning a chamber of a deposition reactor is to form a plasma in another (exterior) chamber of a highly reactive etch species, such as fluorine, and deliver the fluorine plasma to the interior of the wafer processing chamber. Since fluorine gas (F2) is highly toxic and difficult to handle as a process gas, it is not generally commercially available, so that another more stable gas such as NF3 is supplied as the process gas, and this gas is ionized in the external chamber to form the required fluorine plasma. NF3 is easy to handle in the gas supply because it is relatively stable, but this stability means that plasma activation requires large power, resulting in a harsh plasma environment. Use of the external chamber spares the wafer processing chamber from exposure limits the etch rate during the cleaning operation. In order to reduce recombination of free fluorine prior to reaching the wafer processing chamber interior walls, the secondary chamber is placed virtually on top of the wafer processing chamber, and a direct port-to-port path for the fluorine is provided between the two chambers. Thus, fluorine enters the wafer processing chamber from a single port, typically in the chamber ceiling. While this approach does provide a limited improvement in performance, the single entry point of the fluorine dictates a non-uniform distribution of fluorine in the chamber, so that chamber interior components nearer the ceiling are cleaned sooner, while chamber components nearer the floor of the chamber are cleaned last. This latter aspect contributes to the amount of time required to clean the chamber.

Attempts have been made to reduce the time required to clean the chamber (by increasing the etch rate during the chamber clean operation). This entailed increasing the amount of fluorine gas flow to the secondary chamber and increasing the plasma source power applied to the secondary chamber. The result has been an increase in the amount of free fluorine ions and radicals furnished to the wafer processing chamber from the secondary chamber. For example, if the secondary chamber is an inductively coupled plasma reactor, then the RF power applied to its inductive antenna is increased.

Surprisingly, such attempts have resulted in very little if any improvement in etch rate and the time required to clean the wafer processing chamber. Moreover, such an approach involves certain disadvantages. Specifically, the RF power generator, the impedance match circuit and the antenna of the secondary chamber must be capable of sustaining high RF power levels (e.g., thousands of Watts), which entails greater expense. Moreover, the increase in fluorine gas flow is limited by environmental restrictions on the use of fluorine gas.

The present inventors have discovered that the failure to realize a concomitant improvement in etch rate in the wafer processing chamber in response to greater supply of free fluorine from the secondary chamber arises from several factors. First, the single entry port provided for the incoming free fluorine ions and radicals faces the center of the chamber interior in order to realize a more even distribution of fluorine across the chamber walls. This however directs most of the free fluorine to the center of the chamber interior—and away from the chamber walls—so that much of the fluorine must travel (diffuse) from the center toward the chamber walls before it can attack the accumulated contamination on the walls. During this travel, much of the free fluorine recombines into F2, thereby reducing the etch rate.

Second, the introduction of the free fluorine at the ceiling propels the free fluorine toward the pumping annulus near the bottom of the chamber, so that much of the free fluorine is pumped out of the chamber before it ever diffuses toward the chamber side walls or other chamber components. In fact, we have measured the proportion of fluorine that fails to diffuse toward the chamber walls, and find that it is about half the free fluorine. Thus, the free fluorine is introduced over the center of the chamber and travels downwardly toward the chamber floor, where much of it is pumped out of the chamber before it can reach the chamber walls. Apparently, increasing the amount of free fluorine flowing into the wafer processing chamber merely increases the amount of fluorine pumped out through the pumping annulus without appreciably increasing the amount of free fluorine reaching the chamber side walls.

A further problem is that introduction of the free fluorine at the single entry port at the ceiling provides an uneven distribution of free fluorine within the chamber, so that chamber walls and components near the ceiling are cleaned first while chamber walls and components nearer the chamber floor are cleaned more slowly and are therefore the last to be cleaned. The cleaning step must be carried on for the amount of time required to clean the components and walls near the floor—the last components to be cleaned. Thus, the uneven distribution of free fluorine slows down the cleaning process.

These problems are exacerbated as wafer size—and hence chamber size—increases. The volume of a larger chamber increases with the square of the chamber radius, and it is this volume in which much of the free fluorine resides before it either recombines or is removed through the pumping annulus. Thus, as wafer size scales upwardly, the foregoing problems worsen.

One technique we considered in an attempt to overcome the foregoing problems is to re-ionize the F2 molecules into which the free fluorine had recombined. Such re-ionization could be carried out in the wafer processing chamber ("in-situ") using existing RF power applicators (e.g., an RF generator connected to the wafer support pedestal and/or an RF generator connected to an inductive antenna of the wafer processing chamber). The problem with this approach is that such re-ionization would be effective only near such RF power applicators, and would be relatively ineffective otherwise. That is, for chamber walls and components relatively far from any RF power applicator of the chamber, there would be less re-ionization (or none at all) and therefore the time to clean such distant components would be little improved, or not improved at all. Therefore, in-situ cleaning appears to provide no solution to the problem.

In summary, it has seemed impractical to completely fulfill the prior art goal of minimizing recombination in order to deliver free fluorine directly from the secondary chamber to the interior walls and components of the wafer processing chamber

SUMMARY

An electro-negative cleaning or etchant gas, such as fluorine, that was ionized from a stable supply gas such as NH3 in a secondary chamber and recombined in the primary chamber, is re-ionized within the primary chamber by electron attachment by ionizing an electron donor gas, such as helium, in the primary chamber.

DETAILED DESCRIPTION

Figure 1:
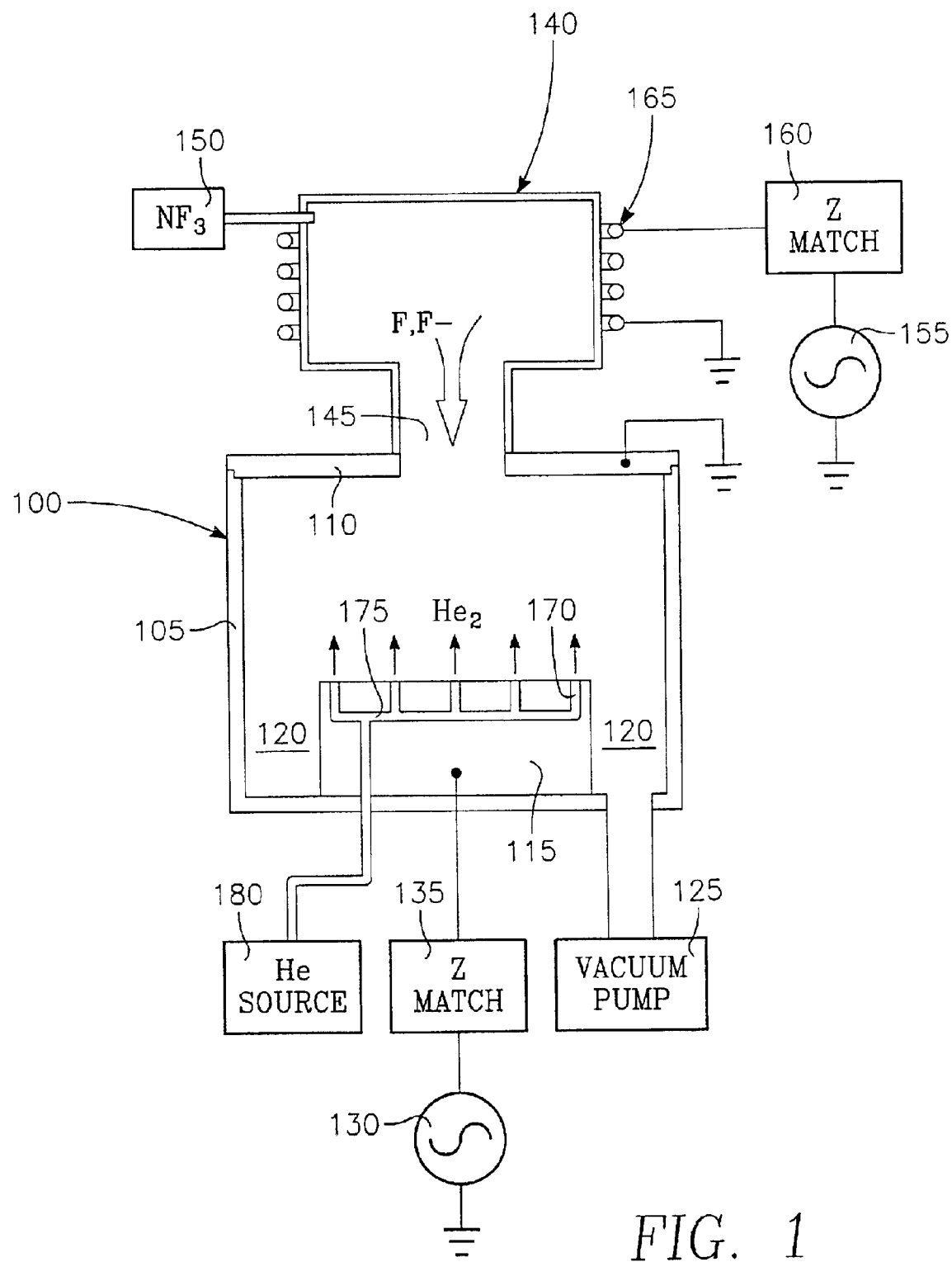
FIG. 1 illustrates a first embodiment.

In the following description, reference is made to fluorine as the cleaning agent. However, the invention may be carried out with any suitable electronegative species that can be ionized by electron attachment, and is therefore not limited to fluorine as the cleaning agent.

The invention discards the prior art goal of minimizing recombination in order to deliver free fluorine directly from the secondary chamber to the interior walls and components of the wafer processing chamber. Instead, the present invention works perfectly well even if all the free fluorine from the external chamber has recombined to F2 prior to reaching the chamber interior walls. The present invention furnishes free fluorine to all chamber interior walls and components by performing electron attachment to fluorine at the interior chamber walls and components. An abundance of free electrons is provided across the interior chamber walls and components by ionizing a rich donor gas (such as, for example, helium gas) in the wafer processing chamber, which requires a relatively small amount of RF power applied to an RF power applicator of the wafer processing chamber (e.g., an inductive antenna or the wafer pedestal or an electrode). The free electrons thus formed from the donor gas tend to diffuse uniformly throughout the chamber and, at least in many cases, form a rich free electron cloud across all the interior chamber walls and components. The fluorine reaching the chamber walls from the external reactor will be predominantly recombined F2 gas (the remaining fraction being free fluorine). The F2 gas at the chamber walls—and in the chamber interior as well—is immediately ionized to free fluorine ions by electron attachment in the presence of the rich electron cloud. The result is that at least nearly all the fluorine reaching the chamber walls is free fluorine, and therefore the interior chamber surfaces (walls and components) are cleaned far more quickly and uniformly with relatively little extra expense in RF power. As a result, in many cases the amount of fluorine furnished by the external chamber may be greatly reduced, and the plasma source power applied in the external chamber may also be greatly reduced without detracting from the superior cleaning speed.

It is seen, then, that the external or secondary chamber that ionizes the NF3 gas now merely serves to provide, ultimately, recombined F2 gas, which is then re-ionized near the chamber interior walls by electron attachment.

The foregoing obviates the need for a short direct path of free fluorine from the external chamber to a single entry port of the wafer processing chamber, although such a single entry port may be retained. However, if the single entry port is eliminated, then the free fluorine from the external chamber may be channeled through a supply tube of any desired length (since recombination of free fluorine to F2 is not a problem now), so that the external chamber need not sit on or near the wafer processing chamber. Moreover, the incoming fluorine, predominantly recombined F2, may be passed through a gas manifold into gas injection orifices or gas injection jets around the chamber that provide an optimal gas spray pattern across the chamber interior walls and components. With such a more uniform fluorine gas distribution across the chamber interior walls and components, the amount of fluorine provided by the external chamber may be reduced even further while still realizing the greater cleaning speed.

In order to increase the residence time of the fluorine (F2) in the chamber, the spray nozzles or orifices that inject the F2 gas may be located near the pumping annulus (at the bottom of a typical chamber) and spray the gas in a direction opposite from the pumping annulus. Furthermore, in order to increase the amount of fluorine that reaches the interior chamber side walls and the like, the spray nozzles or spray orifices may spray the F2 gas close to and parallel to the surface of the chamber side walls, rather than toward the center of the chamber. With such arrangement, the F2 gas flows upwardly from the bottom of the chamber in a thin annular cloud that touches the chamber side wall and travels up to the ceiling before turning toward the center and falling downwardly into the pumping annulus. This maximizes the amount of fluorine delivered to the chamber interior walls. Since the free electrons produced by ionizing the donor gas (e.g., helium) are plentiful near the chamber side walls and ceiling, at least virtually all of the fluorine at the chamber side walls and ceiling is ionized by electron attachment. The efficiency of this arrangement is such that the amount of fluorine delivered from the external chamber may be greatly reduced, while the etch rate of contaminants on even the most remote interior surfaces of the chamber will be at least about twice that of current chamber cleaning techniques.

In order to adjust the cleaning rates in different parts of the chamber, the various RF power applicators with which the wafer processing chamber is equipped may be exploited. For example, during cleaning, the etch rate near the ceiling may be enhanced by driving the wafer support pedestal with RF power while grounding either the ceiling (if it is conductive) or, otherwise, grounding a coil antenna overlying the ceiling. In order to enhance the etch rate near the side wall, instead of the ceiling, the ceiling or the overlying inductive antenna would be connected to a floating potential while either the side wall or a coil antenna surrounding the side wall may be grounded, for example. Numerous variations are possible, all involving selective connections of the side wall, ceiling, overhead coil antenna or side coil antenna to any one of an RF power source, ground or a floating potential.

Referring to FIG. 1, a wafer processing plasma reactor chamber 100, hereinafter referred to as the primary chamber 100, includes a side wall 105, an overhead ceiling 110 and a wafer support pedestal 115. A pumping annulus 120 is defined between the pedestal 115 and the side wall 105. A vacuum is maintained within the chamber 100 by a vacuum pump 125 coupled to the bottom of the pumping annulus 120. A RF power generator 130 is connected through an impedance match circuit 135 to the wafer pedestal. During wafer processing, a semiconductor wafer (not shown) is held on top of the pedestal 115, and RF power applied to the wafer pedestal 115 controls plasma ion energy near the wafer surface. During wafer processing, contamination formed from plasma species in the primary chamber accumulates on the side wall 105 and ceiling 110 of the primary chamber 100, and must be cleaned off periodically during a chamber cleaning operation, typically after processing at least one wafer. The type of material thus accumulated on the interior surfaces of the side wall 105, ceiling 110 and other components depends upon the type of plasma process being carried out. As but one example, chemical vapor deposition on the wafer of silicon dioxide will cause silicon dioxide to form on the chamber interior surfaces. As another example, a silicon dioxide etch process using fluoro-carbon process gas will cause polymer to accumulate on the interior surfaces within the chamber 100. Such a polymer must be removed or cleaned off by an etch process, typically carried out with free fluorine as the etchant.

Prior to a chamber cleaning operation, the wafer (not shown) is removed from the pedestal 115, and fluorine, in the form of fluorine ions and radicals as well as fluorine gas, is introduced into the chamber 100. For this purpose, a secondary plasma reactor chamber 140 produces these fluorine species and furnishes them to the primary chamber through a port 145. The secondary plasma chamber 140 ionizes NF3 gas supplied by an NF3 gas source 150. Some of these ions may combine inside the primary chamber 100 to form fluorine gas. The ionization energy may be applied to the secondary chamber 140 in one of a number of suitable ways. In the example illustrated in FIG. 1, plasma source power is applied by an RF generator 155 with an impedance match circuit 160 through a coil antenna 165 surrounding the secondary chamber 140. A vacuum pump (not shown) may be coupled to the secondary chamber 140 in order to control chamber pressure. The free fluorine formed in the secondary chamber 140 is drawn through the port 145 into the primary chamber 100.

As the free fluorine travels within the primary chamber 100, a portion or all of it recombines to form fluorine gas (F2) before reaching the side wall 105 and ceiling 110. Fluorine gas is ineffective as a cleaning or etching agent, and therefore such recombination inhibits the cleaning operation, a significant problem. In order to counteract this problem, the fluorine gas is ionized within the primary chamber by electron attachment. This is accomplished by introducing a supply of free electrons throughout the primary chamber 100 (or at least near the walls 105 and ceiling 110 thereof). The free electrons are produced by introducing into the primary chamber an electron donor species that is a good source of free electrons and is relatively easy to ionize, such as helium gas. An RF power applicator, such as the RF generator 130 coupled to the wafer pedestal 115, applies sufficient power to ionize the electron donor gas. The ceiling 110 or the side wall 105 may be grounded to provide an RF return path or counter-electrode to the wafer pedestal 115. If helium is the electron donor gas, then a relatively small amount of RF power is required in the primary chamber 100, about an order of magnitude less than the RF power required to ionize NF3 gas in the secondary chamber 140.

The helium may be introduced in any suitable fashion. For certain types of wafer processing chambers, the helium may be introduced through the wafer pedestal 115. This is because such chambers employ helium gas to cool the backside of the wafer during processing, and therefore have helium injection orifices 170 in the top surface of the wafer pedestal 115. The orifices are fed by a gas manifold 175 coupled to a helium supply 180. In this instance, the cleaning operation consists of introducing fluorine from the secondary chamber 140 into the primary chamber 100, at least some of which recombines to form fluorine gas in the primary chamber 100. The cleaning operation in this instance further consists of pumping helium into the chamber 100 through the injection orifices 170 in the wafer pedestal while applying RF power to the wafer pedestal 115 from the RF power generator 130. This latter step ionizes the fluorine gas by electron attachment.

Figure 2:
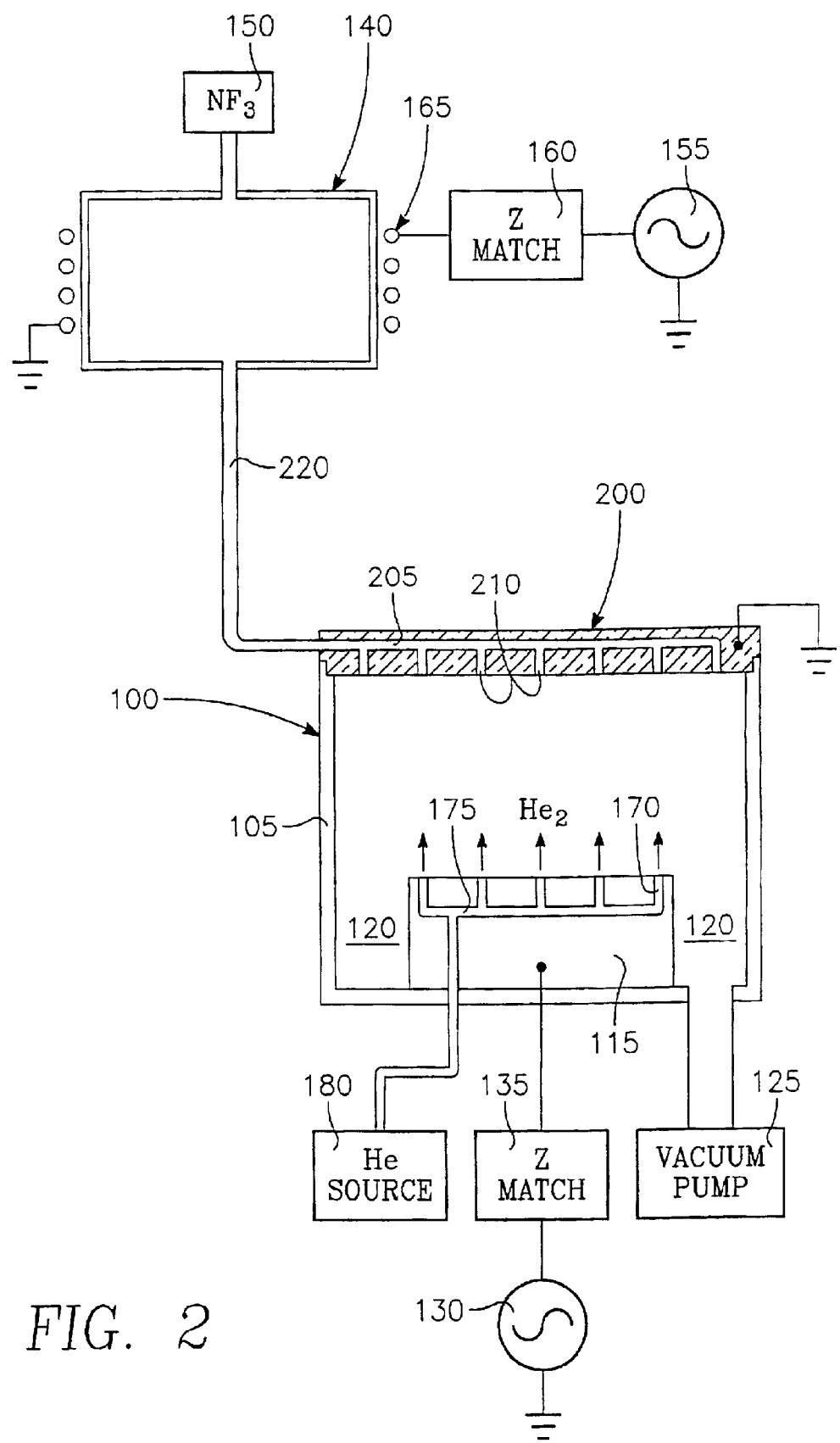
FIG. 2 illustrates a second embodiment.

In order to provide a more uniform radial distribution of the fluorine ions and gas, the single central port 145 of FIG. 1 may be improved upon by replacing the ceiling 110 and port 145 with a gas distribution plate 200 as illustrated in FIG. 2. The fluorine ions and gas from the secondary chamber 140 enter a gas manifold 205 within the gas distribution plate 200. As a result of collisions occurring during the confinement within the gas distribution plate 200 at least nearly all of the fluorine ions recombine to form fluorine gas, which is injected into the primary chamber 100 through many gas injection orifices 210 within the gas distribution plate 200. Each gas distribution orifice receives fluorine gas from the gas manifold 205.

Since recombination of the fluorine ions formed in the secondary chamber 140 does not impact the cleaning process of the present invention, the secondary chamber 140 need not be located particularly close to the primary chamber 100, and in fact can be separated from it by a relatively long gas feed tube 220 that carries the fluorine ions and gas from the secondary chamber 140 to the gas manifold 205 of the primary chamber.

Figure 3:
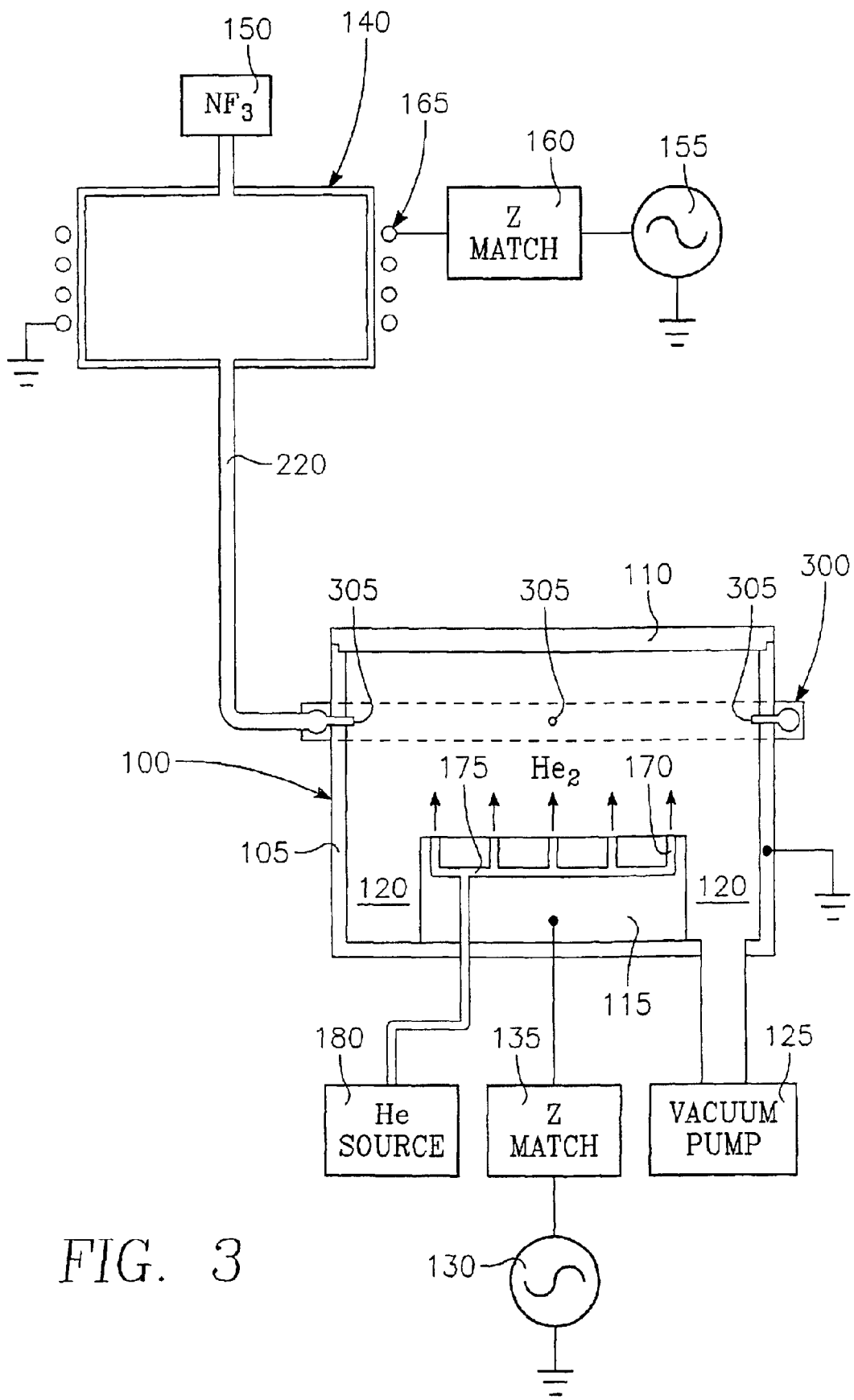
FIG. 3 illustrates a third embodiment.

While the embodiment of FIG. 2 provides superior uniformity of radial distribution of the fluorine near the ceiling, the distribution is not necessarily uniform in the axial (vertical) direction. Referring to FIG. 3, in order to provide better uniformity in the axial direction, the fluorine ions and gas from the secondary chamber 140 may be fed to a circumferential gas manifold 300 surrounding the chamber 100 and injected through plural gas injection nozzles 305 extending toward the chamber interior and distributed about the circumference of the chamber 100. The nozzles 305 may be located halfway (or any other suitable height) between the ceiling 110 and wafer pedestal 115 so that the distribution of fluorine within the chamber is more uniform in the vertical direction. Alternatively, rather than a plurality of discrete nozzles, the element 305 of FIG. 3 may be a continuous circumferential gap nozzle consisting of axially narrow elongate opening that extends around or completely around the chamber in a circle. Thus, the fluorine gas may be injected through plural discrete nozzle elements or through a single circumferential gap nozzle element.

There are two potential limitations with each of the embodiments describe above with reference to FIGS. 1-4. One potential limitation is that fluorine gas is injected toward the center of the chamber so that much of it never reaches the chamber side wall 105 before being carried out through the pumping annulus 120, and is therefore wasted. Another potential limitation is that a large fraction of the fluorine is propelled by the spray nozzles or orifices in a direction toward the pumping annulus 120, which hastens the passage of that fraction of the fluorine into the pumping annulus before it can reach the walls or chamber components needing to be cleaned. Both of these limitations reduce the rate of cleaning by preventing some fluorine from reaching the side wall or ceiling.

Figure 4:
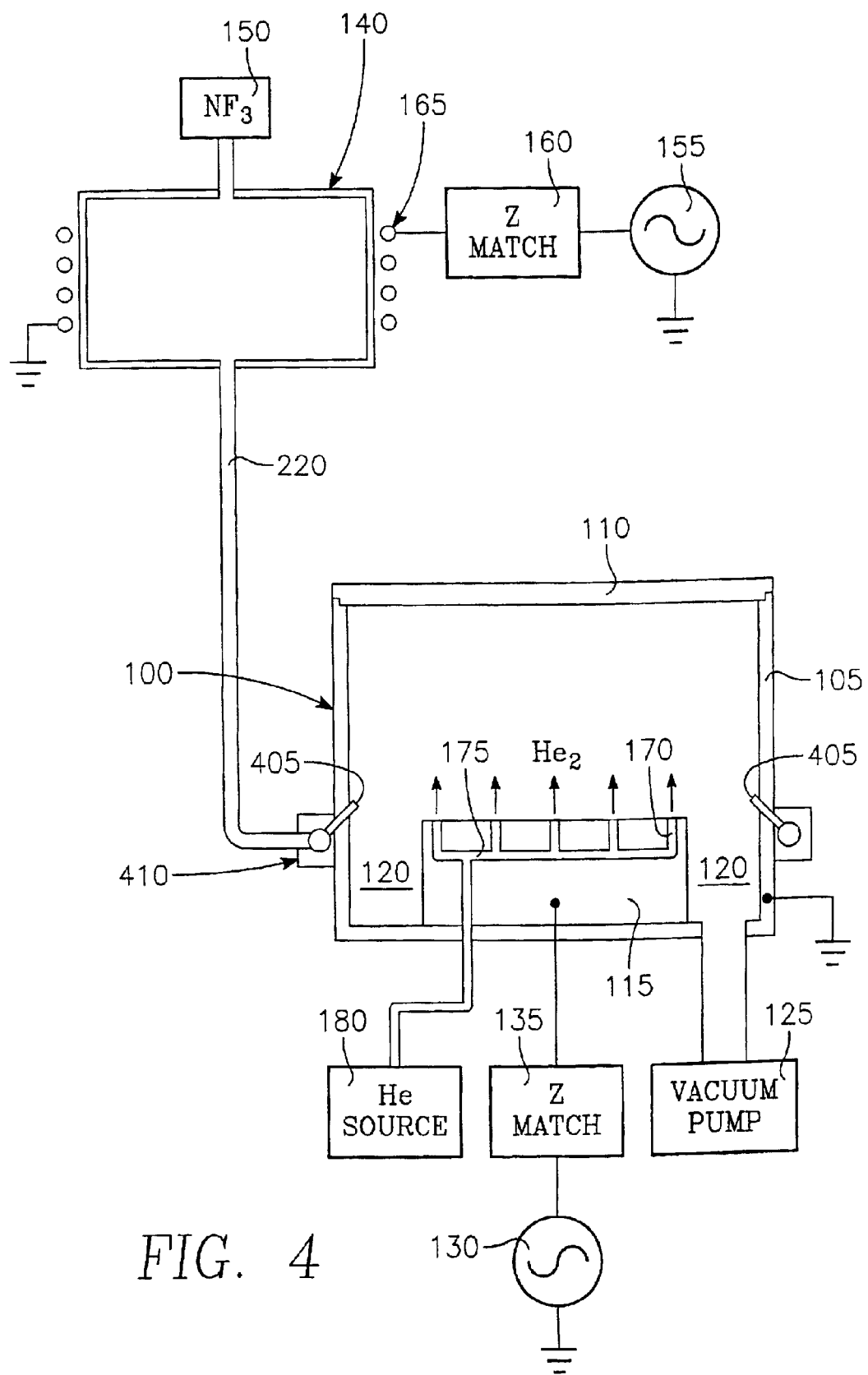
FIG. 4 illustrates a fourth embodiment.

Referring to FIG. 4, these limitations are overcome by adopting one or both of two features. First, the horizontally directed spray nozzles 305 of FIG. 3 are replaced by vertically (or near vertically) pointing spray nozzles 405 coupled to a common gas manifold 410 that receives the fluorine gas and ions from the secondary chamber 140. The nozzles 405 propel the incoming fluorine gas in a direction parallel (or nearly parallel) to the surface of the side wall 105, and release the gas very close to the side wall 105. Therefore, the fluorine is concentrated around the side wall 105. Secondly, the spray nozzles 405 are located near the pumping annulus 120 (near the floor or bottom of the chamber 100) and point in a direction away from the pumping annulus 120 (i.e., they point vertically up). This latter feature exploits the momentum of the incoming fluorine gas to resist the suction of the vacuum pump 125 as they travel away from the pumping annulus 120. Eventually all the fluorine gas molecules will reverse direction and travel downwardly into the pumping annulus, but in doing so spend a much longer time inside the primary chamber 100. This increases the residency time of the fluorine within the primary chamber so that it is used more efficiently.

The nozzles 405 at the side wall 105 may be located so close to the pumping annulus 120 (or within the pumping annulus 120) that at least nearly all of the interior chamber surfaces that need cleaning are at or above the nozzles 405. With this feature, the vertically upward direction in which the fluorine gas is injected by the nozzles is the best direction (although variations from this direction may be used in various implementations). The gas injection velocity at the nozzles 405 should be sufficient to drive much or all of the gas at least nearly to the ceiling 110. The gas nozzle injection velocity is determined in conventional fashion by the nozzle gas pressure and the diameter of the nozzle opening that faces into the chamber 100. Alternatively, a circumferential gap nozzle may be employed instead of plural discrete injection nozzles. Thus, the element 405 of FIG. 5 may be a continuous gap or slit extending circularly around the interior of the cylindrical side wall 105. The slit 405 of such an embodiment would be sufficiently narrow to realize the same gas flow rate realized using the plural discrete injection nozzles referred to above.

Directing the fluorine gas along the surface of the side wall 105 as described above minimizes the amount of fluorine gas lost to the center of the chamber 100 and maximizes the amount of fluorine gas in the vicinity of the side wall 105 and ceiling 110. The incoming fluorine gas streams upwardly in a thin annulus along the side wall 105 and then travels radially inwardly as it nears the ceiling 110. After reaching the ceiling 110, the fluorine gas begins traveling downwardly to the pumping annulus 120 as it spreads radially.

The spray nozzles 405 may be replaced by other gas injection devices that launch the incoming gas along the same upward path next to the side wall 105. Such other gas injection devices may include a gas distribution plate, or an array of gas distribution orifices directed upwardly near the side wall 105.

Figure 5:
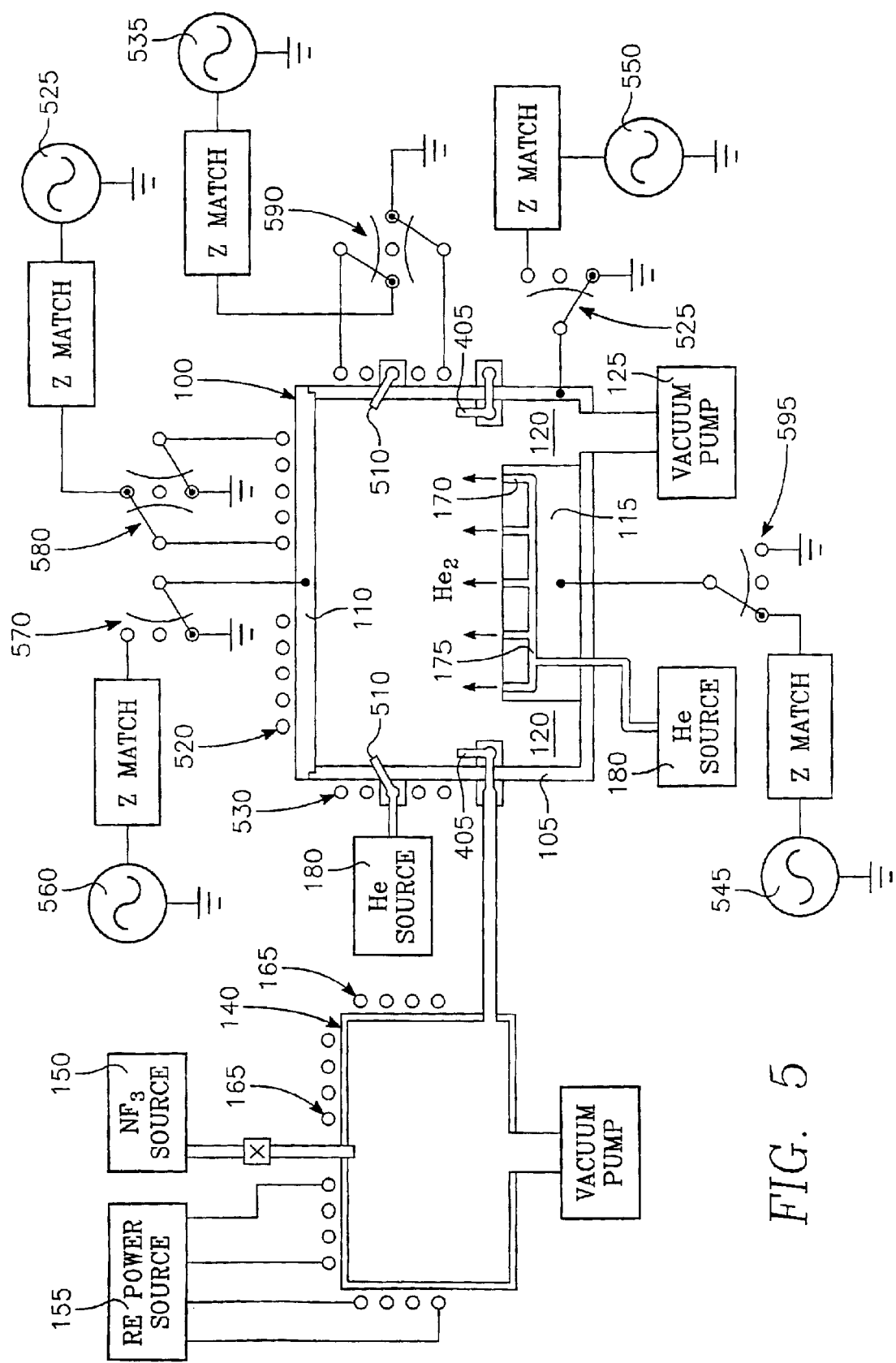
FIG. 5 illustrates a fifth embodiment

Referring to FIG. 5, the electron donor gas (e.g., helium) may be injected using apparatus other than the wafer support pedestal 115. For example, nozzles 510 facing inwardly from the sidewall 105 may be used to inject helium into the chamber 100. Alternatively, the helium may be injected using a gas distribution plate, such as the gas distribution plate 200 of FIG. 2, while the fluorine is injected from the nozzles 405 near the chamber floor as in FIGS. 4 and 5.

Significantly, the primary or wafer processing chamber 100 of FIG. 5 is equipped with a number of RF power applicators for use during wafer processing. As shown in FIG. 5, each of these RF power applicators is coupled to an RF power generator through an appropriate impedance match circuit. Each such impedance match circuit is labeled Z MATCH in the drawing, and such devices may be dynamic impedance match circuits of the type well-known in the art. The RF power applicators include an overhead coil antenna 520 overlying the ceiling 110 and connectable to an RF power generator 525, a cylindrical coil antenna 530 wrapped around the side wall 105 and connectable to an RF power generator 535, and the wafer pedestal 115 connectable to an RF power generator 545. In addition, the side wall 105 and/or the ceiling 110 may be made of a material, such as doped silicon, that is nearly transparent to the inductive field of the overhead coil 520 but sufficiently conductive to function as an electrode. In such a case, the side wall 105 and/or the ceiling 110) may be connectable to RF power sources 550, 560 respectively, to support capacitive coupling of RF power into the chamber 100 during wafer processing.

Such RF power applicators may be exploited during the chamber cleaning operation to shape the fluorine ion distribution. For example, in order to enhance the fluorine ion distribution near the side wall 105, the cylindrical coil antenna 530 surrounding the side wall 105 may be grounded at both ends so as to function as a counter electrode to the wafer pedestal 115, while the wafer pedestal is driven by the RF generator 545. Alternatively, the side wall 105 may be grounded for the same purpose. This increases the electric field near the side wall and therefore increases the free electron density there, thereby increasing the fluorine ionization by electron attachment near the side wall 105. The same can be accomplished near the ceiling 110 by either grounding the overhead coil antenna 520 or grounding the ceiling 110 itself.

As another way of increasing fluorine ion density near the side wall, the cylindrical coil 530 may be driven by the RF power generator 535 during the cleaning operation, or the side wall 105 may be driven by the RF power generator 550. At the same time, the wafer pedestal 115 can be either RF driven or grounded. A similar increase in fluorine ion density near the ceiling 110 can be realized by either driving the overhead coil antenna 520 with the RF power generator 525 or by driving the ceiling 110 with the RF power generator 560.

In order to permit all possible permutations and combinations of connections of each of the foregoing RF power applicators to ground, to an RF generator or to a floating potential, switches are provided in the illustrated embodiment of FIG. 5. Specifically, a three-pole switch 570 permits connection of the ceiling 110 to ground, to a floating potential or to the RF generator 560. A three-pole switch 575 permits connection of the side wall 105 to ground, to a floating potential or to the RF generator 550. A pair of three-pole switches 580 permit connection of each of the two ends of the overhead coil antenna 520 to ground, to a floating potential or to the RF generator 525. A pair of three-pole switches 590 permit connection of each of the two ends of the cylindrical coil antenna 530 to ground, to a floating potential or to the RF generator 535. A three-pole switch 595 permits connection of the wafer support pedestal to ground, to a floating potential or to the RF power generator 545.

While the foregoing detailed description refers to fluorine as the etchant species, NF3 as the supply gas furnished to the secondary chamber and helium as the electron donor gas that is ionized in the wafer processing chamber by application of RF power, the etchant species may be any suitable member of the halogen group besides fluorine, the supply gas may be any nonmetal compound of that halogen group member and the electron donor gas may be any suitable element such as one of the inert gases besides helium.

The RF power level required in the secondary chamber to ionize the NF3 supply gas is a high level, while the RF power applied in the wafer processing chamber to ionize the helium gas is a very low level, several times lower than the RF power required to ionize NF3 in the secondary chamber. It is also several times lower than the RF power required to ionize the recombined fluorine molecules in the wafer processing chamber. Thus, since the RF power applied in the wafer processing chamber is insufficient to ionize the fluorine molecules, the RF power applied in the wafer processing chamber is used to ionize (at least for the most part) only the helium gas to produce a rich supply of free electrons throughout the wafer processing chamber. Therefore, practically the only mechanism by which the recombined fluorine molecules are ionized in the wafer processing chamber is by electron attachment to the free electrons produced by the low-power ionization of the helium gas. The result is that a lower RF power level is applied in the wafer processing chamber to produce free fluorine for cleaning the interior chamber surfaces.

The injectors illustrated in FIG. 5 at least initially confine the injected fluorine material from the secondary chamber to a thin annular zone contiguous with the cylindrical side wall interior surface of the wafer processing chamber. This feature, combined with the rich supply of free electrons that fill the chamber generated by ionizing the helium gas, ensures a high concentration of free fluorine along the interior chamber walls.

While the invention has been described in detail by reference to preferred embodiments, it is understood that variations and modifications thereof may be made without departing from the true spirit and scope of the invention.

What is claimed is:

1. In a plasma reactor for processing a substrate, the reactor having a substrate processing chamber containing a substrate support pedestal and having at least one RF power applicator capable of coupling RF power into the substrate processing chamber and a vacuum pump coupled to a pumping port of the substrate processing chamber, the reactor tending to accumulate on its interior surfaces a residue formed from process gases introduced into the substrate processing chamber, a method for removing said residue from said interior surfaces comprising:

ionizing a gas compound of an electro-negative etch species in a secondary plasma chamber to produce an atomically free form of said etch species;

passing from said secondary plasma chamber into said substrate processing chamber at least one of: (a) said atomically free form of said etch species, and (b) molecules of said etch species formed by recombination of said atomically free form of said etch species;

producing free electrons in said substrate processing chamber so as to convert said molecules of said etch species into ions of said etch species by electron attachment.

2. The method of claim 1 wherein the passing comprises maintaining said secondary plasma chamber next to said substrate processing chamber and passing said etch species through a single passageway between the chambers so as to minimize loss of said atomically free form of said etch species by recombination.

3. The method of claim 1 wherein the feeding said etch species through plural injection elements causes said etch species to be injected into said substrate processing chamber in a direction away from said vacuum pumping port, whereby to increase residency time of said etch species in said substrate processing chamber.

4. The method of claim 1 wherein the passing comprises injecting the etch species into the substrate processing chamber near the pumping port and in a direction away from the pumping port.

5. The method of claim 1 wherein the molecules of said etch species is fluorine gas.

6. The method of claim 1 wherein the passing comprises feeding said etch species from said secondary chamber through at least one injection element facing into said substrate processing chamber.

7. The method of claim 6 further comprising feeding said etch species to said plural injection elements through a gas manifold.

8. The method of claim 7 further comprising feeding said etch species through an elongate feed tube connected between said secondary plasma chamber and said substrate processing chamber while maintaining said secondary plasma chamber and said substrate processing chamber at a separation distance corresponding to said elongate feed tube.

9. The method of claim 8 wherein at least most or all of the free atomic form of said etch species recombines into molecules of said etch species prior to injection into said substrate processing chamber.

10. The method of claim 1 wherein the passing comprises injecting said etch species into said substrate processing chamber in a direction away from said pumping port.

11. The method of claim 10 wherein the injecting comprises injecting said etch species in a direction generally parallel to and adjacent an interior surface of said substrate processing chamber.

12. The method of claim 11 wherein said interior surface is a side wall of said substrate processing chamber and said pumping port is near a floor of the substrate processing chamber, and wherein the injecting comprises injecting the etch species at entry points next to said side wall and in a direction away from said floor and toward said ceiling.

13. The method of claim 12 wherein the injecting comprises injecting said etch species near the floor and in a direction away from the floor.

14. The method of claim 1 wherein the producing free electrons in said substrate processing chamber comprises introducing into said substrate processing chamber an electron donor gas and ionizing said electron donor gas by coupling of RF power into said substrate processing chamber by at least the one RF power applicator.

15. The method of claim 14 wherein the ionizing said electron donor gas produces at least nearly an order of magnitude less ionization energy than the ionizing said gas compound of the etch species.

16. The method of claim 14 wherein said substrate processing chamber further comprises plural RF power applicators comprising electrodes and coil antennas comprised within or adjacent walls of said substrate processing chamber, and wherein the coupling RF power into the substrate processing chamber comprises connecting at least one of said RF power applicators to an RF power source and connecting others of said RF power applicators to an RF return potential.

17. The method of claim 16 further comprising connecting further ones of said RF power applicators to a floating potential.

18. The method of claim 15 wherein said electro-negative etch species comprises a member of the halogen chemical group and said electron donor gas comprises one of the inert gases.

19. The method of claim 18 wherein said member of the halogen group comprise fluorine.

20. The method of claim 18 wherein said one inert gas comprises helium.

21. The method of claim 19 wherein said member of the halogen group is $NF_3$.

22. A method of cleaning interior surfaces of a substrate processing chamber comprising:
   ionizing in a secondary plasma chamber a stable gas compound of an electronegative etch species to produce plasma products, said plasma products including molecules of said etch species formed by recombination of ions of said etch species;
   supplying said plasma products into said substrate processing chamber;
   ionizing by electron attachment in said substrate processing chamber the molecules of said electronegative etch species by introducing an electron donor gas into said substrate processing chamber and ionizing said electron donor gas to produce free electrons.

23. The method of claim 22 wherein the supplying said plasma products into said substrate processing chamber comprises introducing said plasma products through a single port between said secondary plasma chamber and said substrate processing chamber.

24. The method of claim 22 wherein the molecules of said etch species is fluorine gas.

25. The method of claim 22 wherein the supplying said plasma products into said substrate processing chamber comprises initially confining said products to an annular zone contiguous with a side wall of said substrate processing chamber.

26. The method of claim 25 wherein the initially confining said products comprises channeling said products to at least one injection nozzle adjacent said side wall.

27. The method of claim 22 wherein the supplying said plasma products into said substrate processing chamber comprises injecting said products into an annular zone contiguous with a side wall of said substrate processing chamber in a direction parallel with said side wall.

28. The method of claim 27 wherein the injecting said products comprises feeding said products to plural gas injection passages facing into said substrate processing chamber located within a thin annular zone contiguous with said side wall and pointing in a gas injection direction at least nearly parallel with said side wall.

29. The method of claim 27 wherein said substrate processing chamber has a pumping port coupled to a vacuum pump corresponding to a gas evacuation direction toward said pumping port, and wherein said gas injection direction of the injecting is generally opposite to said gas evacuation direction.

30. The method of claim 29 wherein the injecting said products comprises feeding said products to plural gas injection passages facing into said substrate processing chamber located within a thin annular zone contiguous with said side wall and pointing in a gas injection direction at least nearly parallel with said side wall and generally opposite to said gas evacuation direction.

31. The method of claim 22 wherein said etch species comprises a halogen element.

32. The method of claim 31 wherein said stable gas compound comprises a compound of said halogen element and a non-metal element.

33. The method of claim 31 wherein said stable gas compound comprises NF3.

34. The method of claim 31 wherein said stable gas compound comprises a compound of said halogen element and a non-metal element.

35. The method of claim 31 wherein said electron donor gas comprises an inert gas.

36. The method of claim 35 wherein said inert gas comprises helium.

37. In a substrate processing chamber tending to accumulate contaminant deposits on its interior surfaces during substrate processing, a method of removing said deposits comprising:
   furnishing into said substrate processing chamber products produced in an external source by ionizing a stable gas compound of an electronegative etch species;
   ionizing molecules of said electronegative etch species by electron attachment in said substrate processing chamber.

38. The method of claim 37 wherein said etch species comprises a halogen element.

39. The method of claim 37 wherein the furnishing the products into said substrate processing chamber comprises introducing said products through a single port between said external source and said substrate processing chamber.

40. The method of claim 37 wherein the furnishing the products into the substrate processing chamber comprises furnishing primarily molecules of said etch species formed by recombination of ions of said etch species.

41. The method of claim 37 wherein the stable gas compound is $NF_3$.

42. The method of claim 37 wherein the molecules of said electronegative etch species is fluorine gas.

43. The method of claim 37 wherein the furnishing said products into said substrate processing chamber comprises initially confining said products to an annular zone contiguous with a side wall of said substrate processing chamber.

44. The method of claim 43 wherein the initially confining said products comprises channeling said products to plural injection nozzles adjacent said side wall.

45. The method of claim 37 wherein the ionizing said electron donor gas comprises applying an amount of RF power that is insufficient to achieve a kinetic ionization of said gas molecules of said etch species.

46. The method of claim 45 wherein the ionizing said electron donor gas comprises applying an amount of RF power that is several time less than that required to ionize said gas compound of said electronegative etch species.

47. The method of claim 37 wherein the furnishing said plasma products into said substrate processing chamber comprises injecting said products into an annular zone contiguous with a side wall of said substrate processing chamber in a direction parallel with said side wall.

48. The method of claim 47 wherein the injecting said products comprises feeding said products to plural gas injection passages facing into said substrate processing chamber located within a thin annular zone contiguous with said side wall and pointing in a gas injection direction at least nearly parallel with said side wall.

49. The method of claim 48 wherein said substrate processing chamber has a pumping port coupled to a vacuum pump corresponding to a gas evacuation direction toward said pumping port, and wherein said gas injection direction of the injecting is generally opposite to said gas evacuation direction.

50. The method of claim 49 wherein the injecting said products comprises feeding said products to plural gas injection passages facing into said substrate processing chamber located within a thin annular zone contiguous with said side wall and pointing in a gas injection direction at least nearly parallel with said side wall and generally opposite to said gas evacuation direction.

51. The method of claim 37 wherein the ionizing said molecules of said electronegative etch species comprises introducing an electron donor gas into said substrate processing chamber and ionizing said electron donor gas to produce free electrons.

52. The method of claim 51 wherein said electron donor gas comprises an inert gas.

53. The method of claim 51 wherein the introducing an electron donor gas comprises injecting said electron donor gas through gas passages in a substrate support pedestal of said substrate processing chamber.

54. The method of claim 51 wherein the introducing an electron donor gas comprises injecting said electron donor gas through gas injection elements facing into said substrate processing chamber.

55. The method of claim 51 wherein said substrate processing chamber comprises RF power applicator apparatus and wherein the ionizing an electron donor gas, comprises applying RF power to said RF power applicator apparatus.

56. The method of claim 55 wherein said RF power applicator apparatus comprises plural RF power applicators at respect locations about said substrate processing chamber, and wherein, the ionizing an electron donor gas comprises enhancing concentration of ions of said etch species near a selected area of an enclosure wall of said substrate processing chamber by applying RF power across two of said RF power applicators while permitting others of said RF power applicators to float electrically, one of said two RF power applicators being adjacent said selected area.

* * * * *